United States Patent [19]

Sanchez

[11] Patent Number: 5,393,604
[45] Date of Patent: Feb. 28, 1995

[54] PRODUCTION OF SILICA "GREEN" TAPE AND CO-FIRED SILICA SUBSTRATES THEREFROM

[75] Inventor: Lloyd E. Sanchez, Huntington Beach, Calif.

[73] Assignee: McDonnell Douglas Corporation, Huntington Beach, Calif.

[21] Appl. No.: 149,357

[22] Filed: Jan. 28, 1988

[51] Int. Cl.$^6$ ..................... B32B 18/00; C04B 35/14
[52] U.S. Cl. ..................... 428/325; 264/61; 264/63; 156/89; 428/336; 428/451; 428/452; 428/446; 428/704; 428/901
[58] Field of Search ............ 264/63, 61, 166; 156/89; 428/325, 22 D, 430, 901, 446, 451, 452, 704, 336

[56] References Cited

U.S. PATENT DOCUMENTS

| | | | |
|---|---|---|---|
| 3,518,756 | 7/1970 | Bennett et al. | 264/63 |
| 4,574,063 | 3/1986 | Scherer | 264/60 |
| 4,624,934 | 11/1986 | Kokubu | 501/67 |
| 4,766,027 | 8/1988 | Burn | 156/89 |
| 4,879,261 | 11/1989 | Burn | 501/49 |

FOREIGN PATENT DOCUMENTS

60-239353 11/1985 Japan.
919372 2/1963 United Kingdom.

OTHER PUBLICATIONS

"Controlled Growth of Monodisperse Silica Spheres in the Micron Size Range", by W. Stober, et al, Journal of Colloid and Interface Science, 26, 62–69 (1968).
Abstract & Translation of Japanese Kokai Patent Pub. No.–054932 Published Mar. 29, 1985.
Volt, Chemical Approach To Glass, Elsevier, Amsterdam 1984, pp. 158–160.

*Primary Examiner*—James Derrington
*Attorney, Agent, or Firm*—Max Geldin

[57] ABSTRACT

Production of silica "green" tapes employed in fabrication of multilayer circuit boards, by mixing silica powder comprised of spherical substantially uniform particles ranging in size from 0.1 to 2 microns, e.g., 0.7 micron, with a liquid medium containing a vinyl acetate—acrylic copolymer emulsion as binder, polyethylene glycol as plasticizer and dispersant, and preferably also including a small amount of boron, in the form of boric acid or boric oxide. The resulting slip is cast on a substrate, such as a polyester tape and dried to produce a crack-free tape. The resulting silica " green" tape is cut into individual tapes, a predetermined circuit pattern is screened onto each tape, preferably employing gold or copper conductors, and the polyester backing is removed from the tapes. The screened silica "green" tapes are then collated and registered to form a stack of layers, and the layers are laminated under pressure and at elevated temperature into a monolithic unit. Such monolithic unit is then fired at a temperature of the order of about 1050° C. into a multilayer circuit board formed of silica having a low dielectric constant and capable of operating efficiently at high frequencies.

27 Claims, No Drawings

PRODUCTION OF SILICA "GREEN" TAPE AND CO-FIRED SILICA SUBSTRATES THEREFROM

BACKGROUND OF THE INVENTION

This invention relates to the production of ceramic tapes and is particularly directed to production of silica "green" tapes, especially applicable in the fabrication of ceramic, multilayer circuit boards by a single firing-(or "co-firing") of stacked circuit and dielectric layers comprised of such silica "green" tapes.

A co-fired ceramic multilayer is a high-density electrical interconnection system in a single monolithic structure, fabricated by a single firing of the stacked and registered circuit and dielectric layers. The layers are made from a ceramic medium, typically cast alumina tape containing binders and other constituents, the individual layers having been screen-printed with appropriate conductor materials.

In this process, a ceramic powder, typically alumina, is mixed with a binder system, and the resulting slurry is cast on a suitable carrier, such as a polyester tape using a doctor blade. The dried, unfired cast tape or sheet is called a "green" tape.

The tape is then subjected to a screening process to lay down a circuit pattern on the individual tapes, and such tapes are then stacked and registered, and the laminated layers are then co-fired, e.g., at temperature of 1600°–1700° C. for several hours in a high-temperature furnace, to form a multilayer board.

Alumina tapes processed by co-fired methods yield lower frequency electronic packages. However, multilayer circuit boards made from relatively high dielectric constant materials, i.e., alumina tapes, do not operate efficiently at high frequencies required by GaAs circuits. Further, such dielectric materials used in a co-fired process operated at the above high temperatures limit the use of the electrical conductors of the circuit patterns to those of the high-temperature refractory metals, such as tungsten and molybdenum, rather than the higher conductivity metals copper and gold, which have lower melting points below the above-noted high co-firing temperature. Additionally, the final firing of the alumina substrates produces dimensional changes in the X and Y directions which are not uniform.

Use of other dielectric tapes, e.g., organics such as teflons and polyimides, are inherently non-hermetic or are difficult to process effectively.

Silica tapes, if capable of being processed effectively by co-fired techniques, would yield electronic hermetic packages with electrical properties conducive to high frequency operation. However, commercially available silica powder, such as fumed silica, because of its extremely high surface area, cannot be processed into "green" ceramic tape without cracking during drying.

The production of ceramic tapes employing alumina or beryllia, and their use in the production of multilayer boards or integrated circuit packaging, as by co-firing layers of such tapes containing individual circuit patterns, is disclosed in the articles "New Ceramics Fill Performance Gaps" Ronald Pound, Electronic Packaging and Production, September, 1987, pp. 30 and 31; "Co-Fired Ceramic Multilayer; When Reliability Counts" Robert Keeler, Electronic Packaging and Production, May, 1987, pp. 40–42; and "Making Thin, Flat Ceramics—A Review" E. P. Hyatt, Ceramic Bulletin, Volume 65, No. 4 (1986).

It is an object of the present invention to provide improved ceramic "green" tape, adapted to be screen-printed with various conductors, laminated to form multilayered structures and co-fired at substantially reduced temperatures as compared to alumina tapes, to produce multilayer circuit boards or interconnects for high frequency applications.

Another object is the provision of silica "green" tapes, which do not crack during firing and which can be screen-printed to form a circuit pattern, and a plurality of such tapes arranged in registered, stacked form and co-fired to produce improved multilayer circuit boards having low dielectric constants and which operate efficiently at high frequencies.

Yet another object is to provide procedure for production of the aforementioned ceramic "green" tapes and for co-firing such tapes containing circuit patterns-in a registered multilayer arrangement, for production of improved multilayer interconnects or multilayer circuit boards.

SUMMARY OF THE INVENTION

An essential feature of the present invention is the production of a silica "green" tape produced from substantially uniform (monosize) spherical silica particle of a size range specified in detail hereinafter. The monosize, spherical silica powder can be formulated into a dense ceramic "green" tape which does not crack and has a relatively low dielectric constant of the order of about 4, as compared to a dielectric constant of about 10 for conventional "alumina" tapes, and has a low "loss" factor.

In the production of a silica "green" tape, according to the invention, the above-noted spherical silica particles are dispersed in a liquid containing dissolved organic binders, particularly in the form of an organosol, and plasticizing modifiers, all diluted in a solvent system, as described in greater detail hereinafter.

The resulting slip or slurry is cast on a suitable substrate, such as a polyester sheet. The tape is dried by solvent evaporation, resulting in a silica tape or sheet which is termed herein a "green" tape.

Such silica "green" tape, as previously noted, is dense and crack-free after drying and has a low dielectric constant. The dried tape can be readily handled and further processed for subsequent screen printing and stacking into layers for co-firing. For this purpose, the tape is cut into predetermined size silica tapes which are subjected to screen printing to lay down a predetermined conductor circuit pattern on each tape or layer. The individual tapes are then removed from the substrate, collated, registered and stacked, and the layer stack is then laminated.

The resulting laminated layers of silica "green" tapes are then co-fired, that is, in a single firing operation, e.g., at temperature of about 1050° C., to form a high density, multilayer circuit board or multilayer interconnection system, in a single monolithic structure, particularly applicable for high frequency applications.

As an additional feature of the invention, a small amount of boron is added to the spherical silica powder, in the form of boric acid or boric oxide. The addition of boron to the silica powder results in a silica "green" tape which can be fired to a fully dense condition at the above-noted temperature of about 1050° C. to form a glass with silica. At such relatively low firing temperature, lower melting and higher conductivity conductor materials, such as gold, can be used as a circuit pattern conductor in either an oxidizing or reducing atmosphere, or copper can be so used in a reducing atmosphere. Further, the addition of boron in small amounts, as noted hereinafter, has minimal effect on increasing the dielectric constant of the silica "green" tape or resultant multilayer board or package.

The resulting co-fired electronic package, e.g., multilayer circuit board, has a low dielectric constant and exhibits the same dimensional changes in X—Y direction after firing.

A multilayer electronic package or circuit board can be produced, according to the invention, containing from 2–20 conductor layers. The invention concept can be employed for production of high frequency semiconductor integrated circuit packaging and as multilayer interconnects for high frequency applications which serve as a base substrate for the attachment of bare GaAs or silicon chips, or for packaged GaAs or silicon devices.

DETAILED DESCRIPTION OF THE INVENTION AND PREFERRED EMBODIMENTS

The silica powder employed in producing the silica "green" tape of the invention is prepared from tetraethyl orthosilicate in a suitable solvent, such as alcohol. Water and aqueous ammonium hydroxide are added to the tetraethyl orthosilicate in alcohol, and the orthosilicate decomposes to ethyl alcohol and silica monomer ($SiO_2$). The silica monomer then commences to polymerize and takes on a spherical form. This reaction is carried out at a temperature of about 15° C. to about 50° C. Following the reaction, the reaction liquid is removed by suitable means, such as filtration and/or evaporation, preferably the latter, and the solid silica particles can be then air-dried or calcined at elevated temperature, air-drying being preferred. The resulting silica powder is essentially amorphous, as determined by X-ray diffraction, and is in the form of spheres, all of which tend to have approximately the same size.

The spherical silica particles thus produced can range in size from about 0.1 to about 2 microns, preferably about 0.1 to about 1, and most desirably about 0.5 to about 0.75, microns. However, as previously noted, the spherical silica particles obtained in the above reaction are generally in the form of monosize spheres, that is, the spheres are very uniform in size, within the particle size ranges noted above. Thus, if the silica particles obtained in the above reaction, depending on the conditions of reaction, have a particle size of 0.7 micron, it has been found that substantially all of the spherical particles will have that size. On the other hand, if desired, a mixture of silica particles of different particle size within the above-noted ranges, say particles varying in size from 0.5 to 0.75 micron, can be employed.

The true density of the silica powder produced as noted above can range from about 0.803 to about 0.87.

In preferred practice, boron in the form of boric acid or boric oxide, $B_2O_3$, is added in minor proportions to the silica powder. Thus, from about 1 to about 3%, preferably about 1.8 to about 2.2%, of boron, in the form of boric acid or boric oxide, based on the total weight of silica and boron, can be employed.

As previously noted, the addition of boron to the silica powder substantially reduces the firing temperature at which the subsequently produced "green" tape laminate can be fired to form a fully densified monolithic substrate. However, as the amount of boron added to the silica is increased, particularly beyond the upper 3% limit noted above, the dielectric constant of the resulting laminate increases undesirably. Since it is desired to obtain as low a dielectric constant as possible, consistent with obtaining a co-firing temperature, preferably not higher than about 1050° C., the amount of boron used is maintained in the above-noted range.

The spherical silica powder is formed into a slip or casting slurry by dispersing the silica in a high volume of a liquid medium. The liquid medium consists essentially of an organosol as binder and preferably also contains a material which functions as a plasticizer or lubricant as well as a dispersant. These materials are employed in a water-based system.

The organosol is in the form of a vinyl-acetate—acrylic copoloymer emulsion, which is a latex-type suspension of polymer material in water, a material of this type being marketed by Monsanto as "Gelva" emulsion resin. It has been found that this organosol is the only binder that can be used effectively with the spherical silica powder to cast the improved silica "green" tape of the invention. The vinyl acetate-acrylic copolymer material should have a suitable molecular weight, preferably ranging from about 2,000 to about 10,000. If the length of the molecular chain of this material is greater than the diameter of the silica powder, it will not allow the powder to fire properly. The amount of organosol binder or vinyl acetate-acrylic copolymer emulsion employed can range from about 15 to about 35%, by weight of the silica powder.

Polyethylene glycol (PEG) is added to the organosol as a plasticizer. The PEG should have a molecular weight not in excess of about 10,000; otherwise, if the molecular weight is higher, it has been found that the resulting silica "green" tape commences to crack. In preferred practice, the PEG has a molecular weight ranging from about 4,000 to about 6,000. Both the organosol and the PEG are water soluble, and these materials form a solution in water. The PEG acts as a dispersant as well as a plasticizer.

The spherical silica powder is added to the above-noted liquid medium, and in preferred practice, the boron-containing material in the form of boric acid or boric oxide is dissolved in the liquid medium so as to provide the proportion of boron and silica powder in the rages noted above. The amount of PEG employed is sufficient to maintain the resulting "green" tape flexible and is generally in a range of about 1% to about 5%, preferably about 3%, by weight of the organosol binder.

If desired, the boric acid or boric oxide can be mixed with the silica powder instead of dissolving it in the liquid medium. However, for this purpose, the boron-containing material, e.g., $B_2O_3$, should be in fine powder state. The mixture of silica powder and boron-containing material is then added to the liquid medium.

The slip is then cast into a tape by spreading it on a flat substrate surface, such as a polyester (Mylar) film. Other substrates, such as cellulose acetate, can also be employed. If desired, the substrate film, e.g., Mylar, can be coated with a silicone to aid in releasing the silica tape from the substrate carrier. A doctor blade is used in casting the film of slurry to a desired thickness.

The substrate containing the slurry film dispersion of the silica particles is then dried at temperature which can range from room temperature to about 60° C., preferably not exceeding about 60° C. It is desirable to accelerate drying, but skinning and trapped gas bubbles result if the slurry film is dried too rapidly.

The thickness of the dried tape can range from about 0.002" to about 0.50". The higher the loading of the silica-containing mixture on the substrate, the thicker the cast dried film. The resultant silica "green" tape does not crack during drying and has a low dielectric constant based on the silica powder employed, of about 4, as contrasted to a high relative dielectric constant of about 10 for alumina tapes.

It has been particularly found that a satisfactory silica-containing slip for producing the improved silica "green" tape of the invention cannot be properly made using a commercial grade of silica, such as fumed silica or hydrogel-processed (precipitated) silica. Such commercial silica powders have a large surface area, and the particles tend to be flat and of highly irregular shape. When it is attempted to formulate such silicas into a slip, the viscosity is usually too high if loaded with sufficient silica, so that it becomes highly difficult to cast. If the silica loading is reduced so as to reduce the viscosity sufficiently low to cast it, the resulting tape will crack. On the other hand, when employing spherical silica according to the invention, and particularly in conjunction with a binder of the type described above, the slip can be loaded with a sufficiently high concentration of spherical silica to have the right viscosity to readily cast the film, and the silica tape does not crack during drying.

After drying, the silica "green" tape is cut into predetermined sizes. The polyester substrate can be removed at this point or subsequently. In preferred practice, it is removed from the tapes after printing and metallization. Via holes are punched into the individual "green" tapes, either with or without the removal of the polyester backing. The punched tapes are then screen-printed and metalized with a predetermined circuit pattern on each of the tapes. Gold metalization can be accomplished employing gold pastes for screen printing. During screen printing, the metalization employed fills the via holes previously punched into each of the tapes. After screen printing, the respective tapes are collated and stacked in proper registry, and the stack of layers is then laminated together into a monolithic "green" circuit unit, by heating the stack under pressure, e.g., at 60° C. and at a pressure of 250-1500 psi. After metallization and prior to stacking the "green" silica tapes, the polyester backing is removed from the tapes, if not previously removed.

The layers of "green" tape forming the monolithic "green" laminate unit are then co-fired at a temperature of about 1050° C., e.g., for a period of about 1-2 hours. As previously noted, it is advantageous to maintain the firing temperature below about 1050° C., because if this temperature is exceeded, it can exceed the melting point of copper or gold used as metalization conductors. It is further noted that when copper is employed as conductor, firing must be carried out in an inert or reducing atmosphere to prevent oxidation of the copper.

During firing, the vinyl-acetate—acrylic copolymer binder is decomposed and driven off.

The resulting multilayer monolithic circuit board has a low dielectric constant of between 4 and 5 and exhibits the same dimensional changes in the X and Y directions after firing, whereas when employing alumina tapes, the final firing of the alumina tape layers produces dimensional changes in the X and Y directions which are not uniform. Further, as previously noted, the co-firing of the laminated layers of silica "green" tapes, according to the invention, requires substantially lower firing temperature as compared to alumina tape laminates, permitting use of higher conductivity conductors, such as copper, gold and silver.

The following is an example of practice of the invention:

EXAMPLE

The following is an example of practice of the 150 cc of aqueous 58% ammonium hydroxide is added to 100 cc tetraethyl orthosilicate in 800 cc alcohol at ambient temperature. After about 15 minutes, particles of silica precipitate in the reaction mixture.

The silica particles are removed from the reaction mixture by filtration and evaporation of liquid, and are air-dried. The resulting silica powder is in the form of spherical particles of substantially uniform size (monosize) and have a diameter of about 0.7 micron.

About 22 grams of boric oxide ($B_2O_3$) is dissolved in about 175 grams of deionized water. The water is heated until all of the boron oxide dissolves. About 9 grams of polyethylene glycol (molecular weight—4,000-6,000) is then dissolved in the hot solution of water and boric oxide.

About 300 grams of the spherical silica powder produced above is transferred to a ball-mill jar for mixing. The mill jar contains approximately 30% by volume of high density alumina balls. The hot solution of deionized water, boric oxide and polyethylene glycol is then added to the silica in the mill jar.

About 105 grams of a vinyl acetate acrylic copolymer emulsion (Monsanto Gelva Emulsion Resin TS-100) is then added to the mill jar. The resulting mixture is milled for about 2 hours. The viscosity of the resulting mixture is measured to be between 600 and 3,000 cps. If the viscosity of the mixture is greater than 3,000 cps, an adjustment to the viscosity is made by measuring the pH of the slip and adjusting it to 7±.2. Ammonium hydroxide or acetic acid is used to adjust the pH of the mixture to the above value. When the pH and viscosity of the mixture are in the correct range, the slip is de-aired by pulling a vacuum on the slip until it starts to boil and boils for one minute.

After cooling and de-airing, the resulting slip is then cast into tape by spreading the slip on a Mylar tape 0.001" thick, using a doctor blade dispenser. The dispenser system is set for a blade height of 0.020", a speed of 1" per minute, and a dryer temperature of 60° C. maximum. This results in a silica "green" tape 0.010 to 0.015" thick, which is crack-free. After drying, the tape is cut into a plurality of tapes of predetermined size.

Via holes and alignment (tooling) holes are then punched into each of the silica "green" tapes as determined by metalization screens for laying down a metalized circuit pattern in each of the tapes. The punched silica "green" tapes to be formed into layers are then metalized according to the circuit design for each layer using gold paste, e.g., Ferro Corporation, 3066 thick film gold. Such paste can be used per se or can be mixed with the spherical silica powder which contains 2% boron. A ratio of 3% such silica powder and 97% gold paste by weight can be employed.

Metalization of each of the tapes is carried out using standard thick film screening techniques and standard stainless steel screens. A particular conductor circuit pattern is thus screen-printed onto each of the silica ("green" ]tapes, and the punched via holes in each tape are also filled at the same time as the circuit is screened onto the respective tapes. It is observed that the respective metalized silica tapes are flexible, with no cracking being apparent.

After room temperature drying, the metalized silica tapes are stripped from the Mylar substrates and the metalized tapes are stacked in the form of layers in correct registry, and the stack is laminated in a hydraulic press at a pressure of 750 pounds/square inch at a temperature of 50° C. to 60° C. for three minutes.

After lamination, the monolithic laminate is then fired in air. The temperature of the unit is raised 2°-8° C./min. to 600° C. The temperature is then increased to about 1050° C. in 1 hour. The laminate is held at this temperature for about 1 hour, then cooled to 600° C. in 1 hour. It is then cooled to 100° C. in 2-5 hours.

After cooling, the resulting monolithic multilayer circuit board is found to have a low dielectric constant of between 4 and 5 and exhibits the same dimensional changes in both the X and Y directions after firing.

From the foregoing, it is seen that the invention provides procedure for producing an improved silica "green" ceramic tape without cracking from spherical silica particles of a preferred size and which can be readily metalized to form a predetermined circuit pattern using conductors, such as gold, having a relatively low melting temperature, and the "green" tapes stacked in a predetermined registered relation, and laminated, and the laminated stack thereafter co-fired at relatively low temperature, e.g., of about 1050° C., with equal shrinkage in X and Y directions after firing, to form a monolithic multilayer circuit board having a relatively low dielectric constant, and which operates efficiently at high frequencies, for example as required by GaAs circuits.

The invention has application for high frequency semi-conductor integrated circuit packaging, e.g., silicon or gallium arsenide integrated circuit chip carriers, and as high frequency electronic interconnect circuits requiring stripline or microstrip controlled impedance techniques.

Since various changes and modifications of the invention will occur to those skilled in the art within the spirit of the invention, the invention is not to be taken as limited except by the scope of the appended claims.

What is claimed is:

1. A process for preparing a silica tape which comprises:
    providing an essentially amorphous silica powder in the form of substantially spherical particles having a diameter ranging from about 0.1 to about 2 microns,
    mixing said silica powder with an aqueous medium containing an organosol, to form a slurry of said silica particles,
    casting said slurry on a support, and
    drying said slurry to form a silica tape on said support.

2. A process for preparing a silica tape which comprises:
    providing a silica powder in the form of substantially spherical particles having a diameter ranging from about 0.1 to about 2 microns, said silica powder obtained by reaction of an alkyl silicate in aqueous alcoholic solution in the presence of ammonium hydroxide,
    mixing said silica powder with an aqueous medium containing an organosol, to form a slurry of said silica particles,
    casting said slurry on a support, and
    drying said slurry to form a silica tape on said support.

3. The process of claim 2, said powder being produced by reacting a tetraalkyl orthosilicate in aqueous alcoholic solution at temperature ranging from about 15° C. to about 50° C. in the presence of ammonium hydroxide.

4. The process of claim 2, wherein said silica powder is essentially amorphous and said spherical silica particles are of substantially uniform size.

5. The process of claim 2, said organosol comprising a vinyl acetate-acrylic copolymer emulsion as binder.

6. The process of claim 5, said aqueous medium also containing polyethylene glycol as plasticizer, said polyethylene glycol having a molecular weight not in excess of about 10,000.

7. The process of claim 2, including adding a small amount of boron to said silica powder or to said aqueous medium, in the form of a boron-containing material selected from the group consisting of boric acid and boric oxide.

8. The process of claim 7, said boron-containing material being present in an amount providing about 1 to about 3% boron, by weight, based on the total weight of the silica powder and boron.

9. The process of claim 8, said organosol comprising a vinyl acetate-acrylic copolymer emulsion as binder, said aqueous medium also containing polyethylene glycol as plasticizer, said polyethylene glycol having a molecular weight ranging from about 4,000 to about 6,000.

10. The process of claim 2, said support for said cast slurry being a polyester or cellulose acetate substrate.

11. The process of claim 2, said casting being carried out employing a doctor blade, and said drying taking place at elevated temperature not exceeding about 60° C.

12. The process of claim 2, including removing said tape from said support, said silica tape being flexible and free of cracking and having a dielectric constant of about 4 and a thickness ranging from about 0.002" to about 0.050".

13. A process for preparing a silica tape which comprises:
    providing an amorphous silica powder of substantially uniform size spherical particles having a diameter ranging from about 0.1 to about 2 microns, said silica powder obtained by reaction of a tetraalkyl orthosilicate in aqueous alcoholic solution in the presence of ammonium hydroxide,
    mixing said silica powder with an aqueous medium containing an organosol comprising a vinyl acetate-acrylic copolymer emulsion as binder, the molecular weight of said copolymer ranging from about 2,000 to about 10,000, the amount of said binder employed ranging from about 15 to about 35%, by weight of said silica powder, said aqueous medium also containing polyethylene glycol as plasticizer, said polyethylene glycol having a molecular weight ranging from about 4,000 to about 6,000, the amount of said polyethylene glycol employed ranging from about 1% to about 5%, by weight of said binder, to form a slurry of said silica particles in said aqueous medium, casting said slurry on a polyester film, employing a doctor blade, and drying said slurry at elevated temperature not exceeding about 60° C., to form a silica tape on said polyester film.

14. The process of claim 13, including adding a small amount of boron to said silica powder or to said aqueous medium, in the form of a boron-containing material selected from the group consisting of boric acid and boric oxide, said boron-containing material being present in an amount providing about 1 to about 3% boron, by weight, based on the total weight of the silica powder and boron, said silica tape being flexible and free of cracking and having a dielectric constant of about 4 and a thickness ranging from about 0.002" to about 0.050", and including removing said tape from said polyester film.

15. The process of claim 13, said silica powder being produced by reacting tetraethyl orthosilicate with aqueous ammonium hydroxide at temperature ranging from about 15° C. to about 50°0 C., and precipitating said spherical particles of silica.

16. A process for producing silica substrates which comprises:
producing a silica tape by the process of claim 2,
removing said tape from said support,
forming a plurality of said tapes into layers of a stack,
laminating the stack of silica tape layers, and
firing said laminated stack at elevated temperature to obtain a monolithic silica substrate having a low dielectric constant.

17. A process for producing silica substrates which comprises:
producing a silica tape by the process of claim 7,
removing said tape from said support,
forming a plurality of said tapes into layers of a stack,
laminating the stack of silica tape layers, and
firing said laminated stack at about 1050° C. to obtain a monolithic silica substrate having a low dielectric constant.

18. A process for producing silica substrates which comprises:
producing a silica tape by the process of claim 13,
removing said tape from said polyester film,
forming a plurality of said tapes into layers of a stack,
laminating the stack of silica tape layers, and
firing said laminated stack at elevated temperature to obtain a monolithic silica substrate having a low dielectric constant.

19. A process for producing silica substrates which comprises:
producing a silica tape by the process of claim 14,
removing said tape from said polyester film,
forming a plurality of said tapes into layers of a stack,
laminating the stack of silica tape layers, and
firing said laminated stack at about 1050° C. to obtain a monolithic silica substrate having a low dielectric constant.

20. A process for producing a multilayer circuit board which comprises:
producing a silica substrate by the process of claim 16, and including the step of printing circuit metalization on each of said plurality of tapes prior to forming said plurality of tapes into a stack of layers, said firing of said laminated stack forming a monolithic multilayer circuit board on a silica substrate.

21. A process for producing a multilayer circuit board which comprises:
producing a silica substrate by the process of claim 17, and including the step of printing circuit metalization on each of said plurality of tapes prior to forming said plurality of tapes into a stack of layers, said firing of said laminated stack forming a monolithic multilayer circuit board on a silica substrate.

22. A process for producing a multilayer circuit board which comprises:
providing a silica tape by the process of claim 1,
cutting said silica tape on said support into a plurality of tapes on said support,
punching via and alignment holes into each of said plurality of tapes on said support,
screening a predetermined pattern of circuit metalization on each of said plurality of tapes, and filling said via holes with said metalization,
removing said plurality of tapes from their respective supports,
forming a plurality of said tapes into a registered stack of layers,
laminating the registered stack of silica tape layers, and
co-firing the laminated stack of layers of silica and circuit metalization to form a monolithic multilayer circuit board having a low dielectric constant and exhibiting substantially the same dimensional changes in X and Y directions after co-firing.

23. A process for producing a multilayer circuit board which comprises:
providing a silica tape by the process of claim 8,
cutting said silica tape on said support into a plurality of tapes on said support,
punching via and alignment holes into each of said plurality of tapes on said support,
screening a predetermined pattern of gold or copper circuit metalization on each of said plurality of tapes, and filling said via holes with said metalization,
removing said plurality of tapes from their respective supports,
forming a plurality of said tapes into a registered stack of layers,
laminating the registered stack of silica tape layers, and
co-firing at about 1050° C. the laminated stack of layers of silica and circuit metalization to form a monolithic multilayer circuit board having a low dielectric constant and exhibiting substantially the same dimensional changes in X and Y directions after co-firing.

24. A process for producing a multilayer circuit board which comprises:
providing a silica tape by the process of claim 13,
cutting said silica tape on said polyester film into a plurality of tapes on said polyester film,
punching via and alignment holes into each of said plurality of tapes on said polyester film,
screening a predetermined pattern of circuit metalization on each of said plurality of tapes, and filling said via holes with said metalization,
removing said plurality of tapes from their respective polyester films,
forming a plurality of said tapes into a registered stack of layers,
laminating the registered stack of silica tape layers, and
co-firing the laminated stack of layers of silica and circuit metalization to form a monolithic multilayer circuit board having a low dielectric constant and exhibiting substantially the same dimensional changes in X and Y directions after co-firing.

25. A process for producing a multilayer circuit board which comprises: 14, cutting said silica tape on said polyester film into a plurality of tapes on said polyester film, punching via and alignment holes into each of said plurality of tapes on said polyester film, screening a predetermined pattern of gold or copper circuit metalization on each of said plurality of tapes, and filling said via holes with said metalization, removing said plurality of tapes from their respective polyester films, forming a plurality of said tapes into a registered stack of layers, laminating the registered stack of silica tape layers, and co-firing at about 1050° C. the laminated stack of layers of silica and circuit metalization to form a monolithic multilayer circuit board having a low dielectric constant and exhibiting substantially the same dimensional changes in X and Y directions after co-firing.

26. A silica tape produced by the process of claim 7, said tape having a low dielectric constant of about 4.

27. A silica tape produced by the process of claim 14, said tape having a low dielectric constant of about 4.

* * * * *